United States Patent
Uzoh

(10) Patent No.: US 11,999,001 B2
(45) Date of Patent: *Jun. 4, 2024

(54) ADVANCED DEVICE ASSEMBLY STRUCTURES AND METHODS

(71) Applicant: Adeia Semiconductor Technologies LLC, San Jose, CA (US)

(72) Inventor: Cyprian Emeka Uzoh, San Jose, CA (US)

(73) Assignee: Adeia Semiconductor Technologies LLC, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/545,322

(22) Filed: Dec. 8, 2021

(65) Prior Publication Data

US 2022/0097166 A1     Mar. 31, 2022

Related U.S. Application Data

(63) Continuation of application No. 14/700,780, filed on Apr. 30, 2015, now abandoned, which is a
(Continued)

(51) Int. Cl.
*H05K 1/11* (2006.01)
*B23K 20/00* (2006.01)
(Continued)

(52) U.S. Cl.
CPC .......... *B23K 20/023* (2013.01); *B23K 20/002* (2013.01); *H01L 21/50* (2013.01);
(Continued)

(58) Field of Classification Search
CPC ..... B23K 20/023; B23K 20/002; H01L 21/50; H01L 23/10; H01L 23/481;
(Continued)

(56) References Cited

U.S. PATENT DOCUMENTS 3,141,238 A    7/1964   Harman
3,839,727 A    10/1974  Herdzik et al.
(Continued)

FOREIGN PATENT DOCUMENTS

CN    101681888 A    3/2010
EP    2800129 A1     11/2014
(Continued)

OTHER PUBLICATIONS

Chinese Office Action for Application No. 201380071665.5 dated Mar. 21, 2016.
(Continued)

*Primary Examiner* — Ishwarbhai B Patel
(74) *Attorney, Agent, or Firm* — Haley Guiliano LLP

(57) ABSTRACT

A microelectronic assembly includes a first substrate having a surface and a first conductive element and a second substrate having a surface and a second conductive element. The assembly further includes an electrically conductive alloy mass joined to the first and second conductive elements. First and second materials of the alloy mass each have a melting point lower than a melting point of the alloy. A concentration of the first material varies in concentration from a relatively higher amount at a location disposed toward the first conductive element to a relatively lower amount toward the second conductive element, and a concentration of the second material varies in concentration from a relatively higher amount at a location disposed toward the second conductive element to a relatively lower amount toward the first conductive element.

20 Claims, 8 Drawing Sheets

Related U.S. Application Data continuation of application No. 13/692,148, filed on Dec. 3, 2012, now Pat. No. 9,024,205.

(51) Int. Cl.

| | |
|---|---|
| *B23K 20/02* | (2006.01) |
| *H01L 21/50* | (2006.01) |
| *H01L 23/00* | (2006.01) |
| *H01L 23/10* | (2006.01) |
| *H01L 23/48* | (2006.01) |
| *H01L 23/49* | (2006.01) |
| *H01L 23/498* | (2006.01) |
| *H05K 1/14* | (2006.01) |
| *H05K 1/18* | (2006.01) |
| *H05K 3/00* | (2006.01) |
| *H05K 3/34* | (2006.01) |
| *H05K 13/04* | (2006.01) |
| *H01L 21/48* | (2006.01) |
| *H01L 21/768* | (2006.01) |

(52) U.S. Cl.
CPC ............ *H01L 23/10* (2013.01); *H01L 23/481* (2013.01); *H01L 23/49* (2013.01); *H01L 23/49811* (2013.01); *H01L 24/13* (2013.01); *H01L 24/14* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 24/98* (2013.01); *H05K 1/11* (2013.01); *H05K 1/14* (2013.01); *H05K 1/144* (2013.01); *H05K 1/18* (2013.01); *H05K 3/0094* (2013.01); *H05K 3/34* (2013.01); *H05K 13/046* (2013.01); *H05K 13/0465* (2013.01); *H01L 21/4853* (2013.01); *H01L 21/76898* (2013.01); *H01L 24/02* (2013.01); *H01L 24/03* (2013.01); *H01L 24/05* (2013.01); *H01L 24/11* (2013.01); *H01L 24/27* (2013.01); *H01L 2224/02372* (2013.01); *H01L 2224/03912* (2013.01); *H01L 2224/0401* (2013.01); *H01L 2224/05023* (2013.01); *H01L 2224/05025* (2013.01); *H01L 2224/05026* (2013.01); *H01L 2224/05027* (2013.01); *H01L 2224/05138* (2013.01); *H01L 2224/05155* (2013.01); *H01L 2224/05157* (2013.01); *H01L 2224/05164* (2013.01); *H01L 2224/05166* (2013.01); *H01L 2224/05171* (2013.01); *H01L 2224/0518* (2013.01); *H01L 2224/05181* (2013.01); *H01L 2224/05184* (2013.01); *H01L 2224/05187* (2013.01); *H01L 2224/05568* (2013.01); *H01L 2224/05569* (2013.01); *H01L 2224/05571* (2013.01); *H01L 2224/05647* (2013.01); *H01L 2224/1145* (2013.01); *H01L 2224/11452* (2013.01); *H01L 2224/11462* (2013.01); *H01L 2224/11464* (2013.01); *H01L 2224/1147* (2013.01); *H01L 2224/13009* (2013.01); *H01L 2224/13017* (2013.01); *H01L 2224/13018* (2013.01); *H01L 2224/13022* (2013.01); *H01L 2224/13023* (2013.01); *H01L 2224/13025* (2013.01); *H01L 2224/13076* (2013.01); *H01L 2224/13078* (2013.01); *H01L 2224/1308* (2013.01); *H01L 2224/13082* (2013.01); *H01L 2224/13083* (2013.01); *H01L 2224/13105* (2013.01); *H01L 2224/13109* (2013.01); *H01L 2224/13138* (2013.01); *H01L 2224/13147* (2013.01); *H01L 2224/13155* (2013.01); *H01L 2224/13184* (2013.01); *H01L 2224/1319* (2013.01); *H01L 2224/14131* (2013.01); *H01L 2224/16145* (2013.01); *H01L 2224/16146* (2013.01); *H01L 2224/16235* (2013.01); *H01L 2224/16501* (2013.01); *H01L 2224/16503* (2013.01); *H01L 2224/16505* (2013.01); *H01L 2224/2745* (2013.01); *H01L 2224/27452* (2013.01); *H01L 2224/27462* (2013.01); *H01L 2224/27464* (2013.01); *H01L 2224/29011* (2013.01); *H01L 2224/29023* (2013.01); *H01L 2224/2908* (2013.01); *H01L 2224/29082* (2013.01); *H01L 2224/29105* (2013.01); *H01L 2224/29109* (2013.01); *H01L 2224/29138* (2013.01); *H01L 2224/29147* (2013.01); *H01L 2224/32225* (2013.01); *H01L 2224/32245* (2013.01); *H01L 2224/32501* (2013.01); *H01L 2224/32505* (2013.01); *H01L 2224/73103* (2013.01); *H01L 2224/73203* (2013.01); *H01L 2224/81075* (2013.01); *H01L 2224/8112* (2013.01); *H01L 2224/81141* (2013.01); *H01L 2224/81193* (2013.01); *H01L 2224/81825* (2013.01); *H01L 2224/83075* (2013.01); *H01L 2224/8312* (2013.01); *H01L 2224/83193* (2013.01); *H01L 2224/83825* (2013.01); *H01L 2924/00014* (2013.01); *H01L 2924/381* (2013.01); *H05K 1/111* (2013.01); *H05K 2201/04* (2013.01); *H05K 2203/04* (2013.01)

(58) Field of Classification Search
CPC ... H01L 23/49811; H01L 24/13; H01L 24/14; H01L 24/16; H01L 24/29; H01L 24/32; H01L 24/73; H01L 24/81; H01L 24/83; H01L 24/98; H01L 21/4853; H01L 21/76898; H01L 24/02; H01L 24/03; H01L 24/05; H01L 24/11; H01L 24/27; H01L 2224/02372; H01L 2224/03912; H01L 2224/0401; H01L 2224/05023; H01L 2224/05025; H01L 2224/05026; H01L 2224/05027; H01L 2224/05138; H01L 2224/05155; H01L 2224/05157; H01L 2224/05164; H01L 2224/05166; H01L 2224/05171; H01L 2224/0518; H01L 2224/05181; H01L 2224/05184; H01L 2224/05187; H01L 2224/05568; H01L 2224/05569; H01L 2224/05571; H01L 2224/05647; H01L 2224/1145; H01L 2224/11452; H01L 2224/11462; H01L 2224/11464; H01L 2224/1147; H01L 2224/13009; H01L 2224/13017; H01L 2224/13018; H01L 2224/13022; H01L 2224/13023; H01L 2224/13025; H01L 2224/13076; H01L 2224/13078; H01L 2224/1308; H01L 2224/13082; H01L 2224/13105; H01L 2224/13109; H01L 2224/13138; H01L 2224/13147; H01L 2224/13155; H01L 2224/13184; H01L 2224/1319; H01L 2224/14131; H01L 2224/16146; H01L 2224/16235; H01L 2224/16501; H01L 2224/16505; H01L 2224/2745; H01L 2224/27452; H01L 2224/27462; H01L 2224/27464; H01L 2224/29011; H01L 2224/29023; H01L 2224/2908; H01L 2224/29082; H01L 2224/29105; H01L 2224/29109; H01L 2224/29138; H01L 2224/29147; H01L 2224/32225; H01L 2224/32245; H01L 2224/32501; H01L 2224/32505;

H01L 2224/73103; H01L 2224/73203;
H01L 2224/81075; H01L 2224/8112;
H01L 2224/81141; H01L 2224/81193;
H01L 2224/81825; H01L 2224/83075;
H01L 2224/8312; H01L 2224/83193;
H01L 2224/83825; H01L 2924/00014;
H01L 2924/381; H05K 3/0094; H05K
3/34; H05K 13/046; H05K 13/0465;
H05K 2203/04

See application file for complete search history.

(56) References Cited

U.S. PATENT DOCUMENTS

| | | | |
|---|---|---|---|
| 5,106,009 | A | 4/1992 | Humpston et al. |
| 5,421,507 | A | 6/1995 | Davis et al. |
| 5,985,692 | A | 11/1999 | Poenisch et al. |
| 5,990,560 | A | 11/1999 | Coult et al. |
| 6,111,274 | A | 8/2000 | Arai |
| 6,196,443 | B1 | 3/2001 | DiGiacomo |
| 6,281,573 | B1 | 8/2001 | Atwood et al. |
| 6,330,967 | B1 | 12/2001 | Milewski et al. |
| 7,009,299 | B2 | 3/2006 | Angst et al. |
| 7,060,601 | B2 | 6/2006 | Savastiouk et al. |
| 7,452,798 | B2 | 11/2008 | Fujinaga et al. |
| 7,777,233 | B2 | 8/2010 | Kahen et al. |
| 7,919,342 | B2 | 4/2011 | Cok |
| 8,240,545 | B1 | 8/2012 | Wang et al. |
| 9,024,205 | B2 * | 5/2015 | Uzoh .................. H05K 3/0094 257/778 |
| 2002/0090756 | A1 | 7/2002 | Tago et al. |
| 2003/0215981 | A1 | 11/2003 | Strouse et al. |
| 2004/0262778 | A1 | 12/2004 | Hua |
| 2005/0133930 | A1 | 6/2005 | Savastisuk et al. |
| 2005/0142685 | A1 | 6/2005 | Ouellet et al. |
| 2007/0034305 | A1 | 2/2007 | Suh |
| 2007/0166875 | A1 | 7/2007 | Vasudevanpillai |
| 2007/0205253 | A1 | 9/2007 | Hubner |
| 2008/0029888 | A1 | 2/2008 | Park et al. |
| 2008/0054458 | A1 | 3/2008 | Ozaki |
| 2009/0075469 | A1 * | 3/2009 | Furman ............... H01L 21/6835 438/613 |
| 2009/0101928 | A1 | 4/2009 | Kim et al. |
| 2011/0067908 | A1 | 3/2011 | Weichslberger et al. |
| 2011/0233787 | A1 | 9/2011 | Wakisaka |
| 2011/0260317 | A1 | 10/2011 | Lu et al. |
| 2011/0268977 | A1 | 11/2011 | Kimura et al. |
| 2012/0199981 | A1 | 8/2012 | Jeong et al. |

FOREIGN PATENT DOCUMENTS

| | | |
|---|---|---|
| GB | 943316 A | 12/1963 |
| JP | S6043878 A | 3/1985 |
| JP | H0266953 A | 3/1990 |
| JP | H03106564 A | 5/1991 |
| JP | H07183304 A | 7/1995 |
| WO | 9418698 A1 | 8/1994 |
| WO | 03097294 A1 | 11/2003 |
| WO | 2006011204 A1 | 2/2006 |

OTHER PUBLICATIONS

Humpston et al., "Diffusion soldering for electronics manufacturing," Endeavour, New Series, vol. 18, No. 2 (1994).

Humpston et al., "Principles of Soldering," ASM International, p. 189, pp. 230-235 (2004).

International Search Report and Written Opinion for Application No. PCT/US2014/042064 dated Nov. 12, 2014.

Kim W K: "Study of Reaction Pathways and Kinetics in Cu(InxGa1—x)Se2 Thin Film Growth. A Dissertation Presented to the Graduate School of the University of Florida in Partial Fulfillment of the Requirements for the Degree of Doctor of Philosophy", 2006, XP055117466, (Provided in 2 files).

MacKay C A: "Amalgams for Improved Electronics Interconnection", IEEE Micro, IEEE Service Center, Los Alamitos, CA, US, vol. 13, No. 2, Apr. 1993, pp. 46-58, XP000355418.

Partial International Search Report for Application No. PCT/US2013/072675 dated May 28, 2014.

Principles of Brazing, ASM International, 2005, p. 207-216.

* cited by examiner

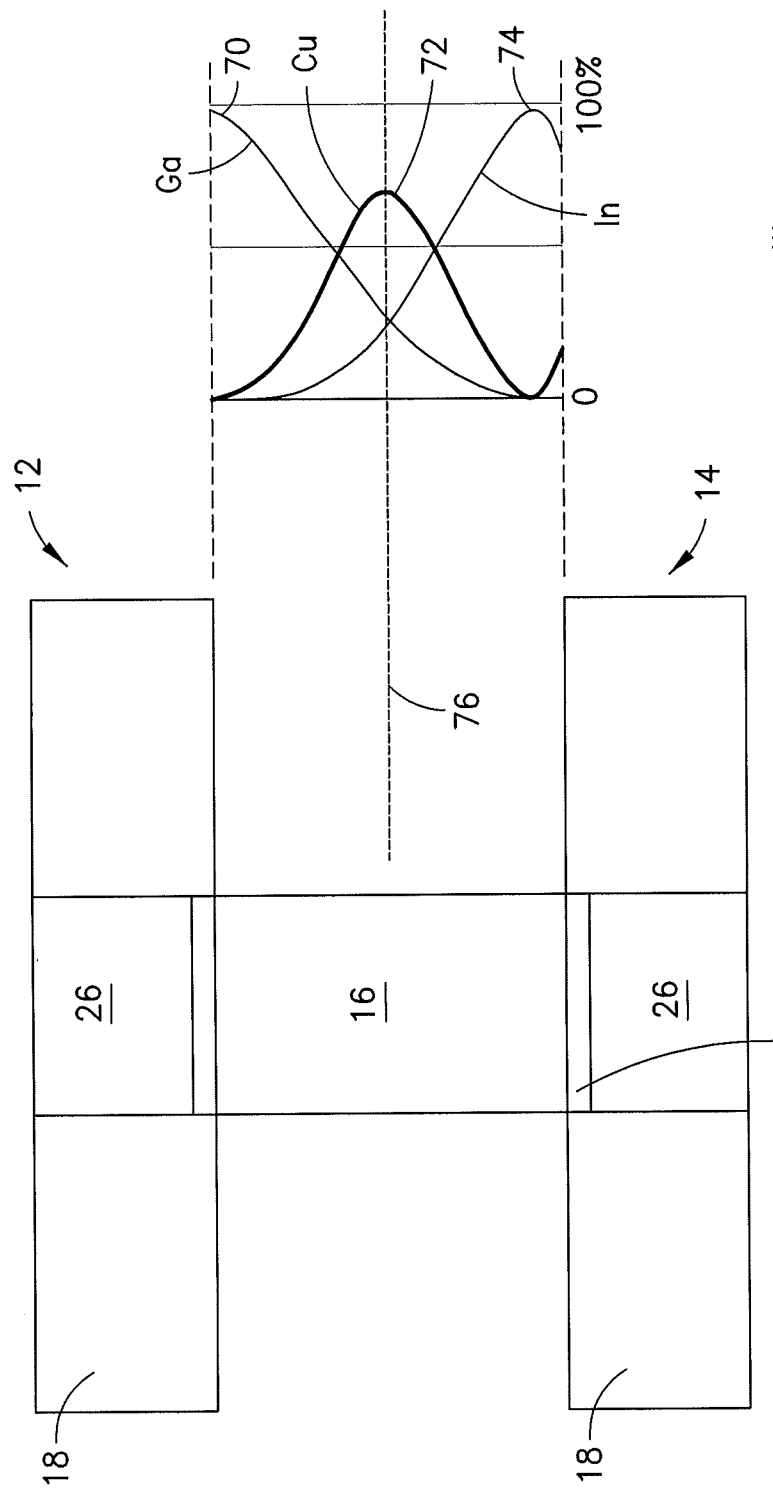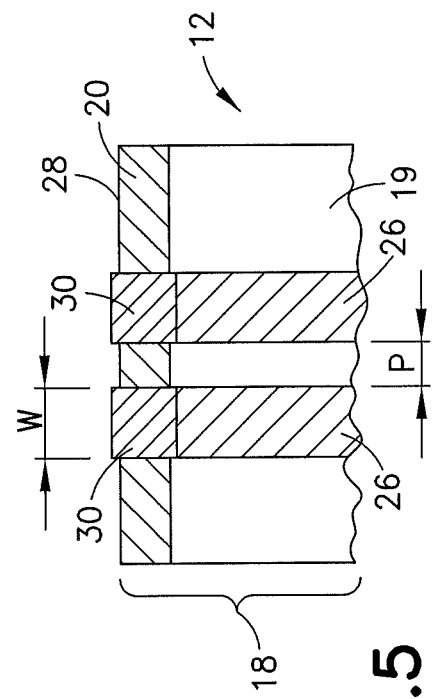

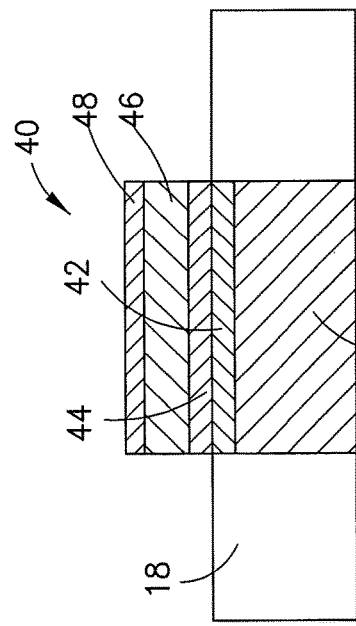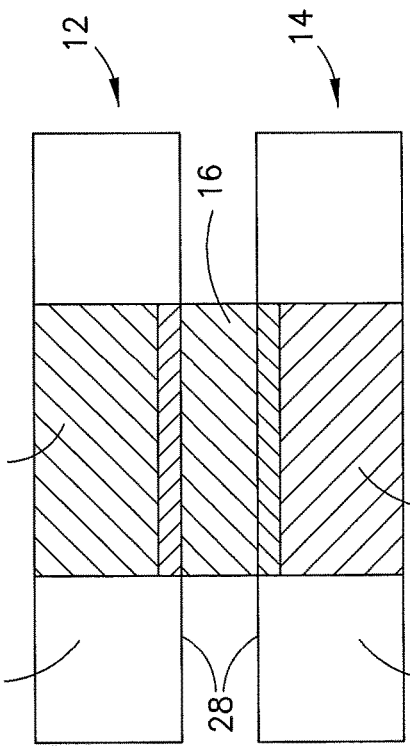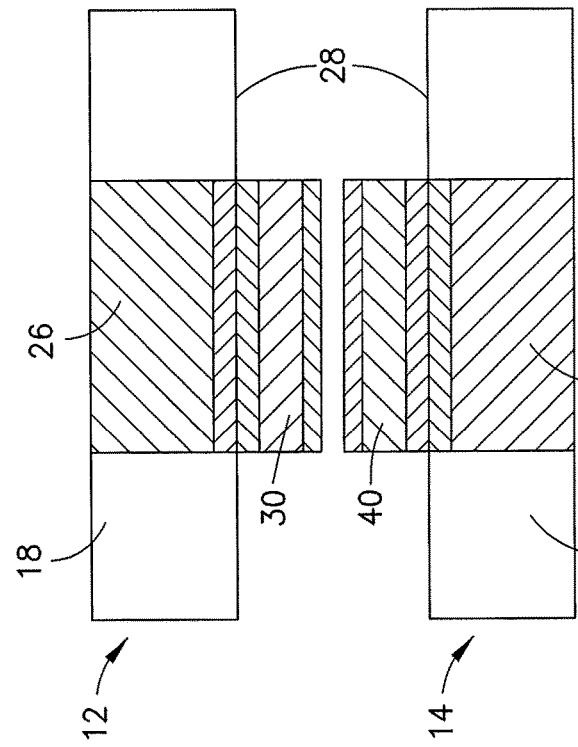

ADVANCED DEVICE ASSEMBLY STRUCTURES AND METHODS

CROSS-REFERENCE TO RELATED APPLICATIONS

The present application is a continuation of U.S. patent application Ser. No. 14/700,780, filed on Apr. 30, 2015, now abandoned, which is a continuation of U.S. patent application Ser. No. 13/692,148, filed on Dec. 3, 2012, now U.S. Pat. No. 9,024,205, the disclosures of which are hereby incorporated herein by reference.

BACKGROUND OF THE INVENTION

Packaged microelectronic devices and related connection components, such as interposers or the like, use various structures to facilitate attachment with other packaged microelectronic devices or connection components to form various microelectronic assemblies. Such structures can include contact pads in the form of enlarged areas of a conductive metal exposed at surfaces of the devices or components. Alternatively, such structures can be in the form of exposed ends of metalized vias, conductive pins, posts, or the like. When aligned with similar connection features in another device or component, the connection features can be joined together using, for example, a conductive joining material, such as a solder mass or the like. Solder masses, such as solder mass 1 shown in FIG. 1A are often used to form such joints because they can be easy to join between structures due to their relatively low melting temperature. Further, such conductive joining masses can be reworkable or reflowable, allowing repair or adjustment of joints.

The use of such joining masses can have some deficiencies, however, in particular such joints, when melted in order to form joints between, for example, contact pads or the like, can undergo lateral deformation. This can be exhibited in widening of the masses prior to cooling, resulting in joints that are wider than the initially-deposited masses. Further, such widening can increase during normal use of the microelectronic assembly due to heating of the joints. As a result, as shown in FIG. 1C, it is generally accepted that a minimum spacing P between conductive connection elements, such as contact pads 2 (FIG. 1B) or the like, is equal to 1.5 times a width W of the conductive connection elements 2 themselves. Further, because the widths of conductive joining masses, such as those of solder or the like, are directly related to the heights thereof (due to surface tension during forming, which takes place in a liquid state), the higher a desired height of such a joint, the greater the width. This relationship can necessitate large contact pads 2 and large pitch P based solely on a desired bond height.

The need for relatively larger contact pads 2 or other connection features can result in increased dishing along bonding surfaces 3 of these features. In particular, when the surfaces of microelectronic devices or connection components are finished by polishing (by chemical or mechanical means), the connection features can develop a concavity. Such concavity can be increased in relatively larger features. This dishing can adversely affect bond strength and is generally not desirable.

BRIEF SUMMARY OF THE INVENTION

An aspect of the present disclosure relates to a microelectronic assembly including a first substrate having a surface and a first conductive element and a second substrate having a surface and a second conductive element. The assembly further includes an electrically conductive alloy mass joined to the first and second conductive elements. The conductive alloy mass includes a first material, a second material, and a third material. The first and second materials each have melting points that are lower than a melting point of the alloy. A concentration of the first material varies in concentration from a relatively higher amount at a location disposed toward the first conductive element to a relatively lower amount toward the second conductive element, and a concentration of the second material varies in concentration from a relatively higher amount at a location disposed toward the second conductive element to a relatively lower amount toward the first conductive element. In an example, at least one of the first or second substrates can be of at least one of a semiconductor material or a dielectric material.

The alloy mass can have a thickness of less than 5 microns. In a further example, the alloy mass has a thickness of less than one micron. The concentration of at least one of the first or second materials can vary monotonically from the relatively higher concentration to the relatively lower concentration. The location of the relatively higher concentration of the first material can be adjacent the first conductive element.

The third material can include at least one of copper, nickel, bismuth, tungsten, cobalt, aluminum, tin, palladium, boron, gold, or silver or an alloy of these materials and the like. Each of the first and second materials can have a melting point of less than 200° Celsius in a state unalloyed with the third material. In a further example, at least one of the first and second materials has a melting point of less than 50° C. in a state unalloyed with the third material. The first and second materials can be low melting point materials. For example, the first and second materials can include different materials selected from tin, indium, and gallium.

In an example, the first conductive element can include a bulk conductor mass with the conductive alloy mass overlying the bulk conductor mass. A portion of the first material can be diffused into the bulk conductor mass. In another example, the first conductive element can further include a barrier layer overlying the bulk conductor mass, and the conductive alloy mass can be joined with the barrier layer.

The first substrate can include a first support material layer of at least one of semiconductor or dielectric material. In such an example, the support material layer can define the surface of the first substrate, and the first conductive element can be a metalized via extending through a portion of the first support material layer and being exposed at the first surface. The first conductive element can define an end surface and an edge surface extending away from the end surface, and a portion of the edge surface can contact the first support material layer within the via. Further, a portion of the edge surface can extend outside of the first support material. In such an example, the second substrate can include a second support material of at least one of a semiconductor or dielectric material and defining the surface of the second element. The second conductive element can also be metalized via extending through a portion of the second support material layer and being exposed at the surface, and at least a portion of the conductive alloy mass can be disposed within the second support material layer.

The first and second conductive elements can each have widths of less than 25 microns at respective bonding interfaces with the conductive alloy mass. In a further example, the first and second conductive elements can each have widths of less than 3 microns at bonding interfaces with the conductive alloy mass.

The first element can include a plurality of first conductive elements, and the second element can include a plurality of second conductive elements. In such an example, a plurality of conductive alloy masses can be joined between respective ones of the first conductive elements and the second conductive elements. IN a further example, the first conductive elements can each have a width, and the first conductive elements can be respectively spaced apart from each other in a lateral direction at a pitch that is less than the width of the first conductive elements.

The first conductive element can include a plurality of capillary structures extending in a direction towards the second element, and the conductive alloy mass can surround and be joined to at least some individual capillary structures of the plurality of capillary structures.

The first element can include a substrate defining the surface of the first element and extending in lateral directions, and the first conductive element can be in the form of a post extending away from the surface.

The first element can further include a microelectronic element electrically connected with the first conductive element.

Another aspect of the present disclosure relates to a microelectronic assembly that includes a first substrate defining a surface and a second substrate defining a surface. The assembly also includes an alloy mass joined to the surfaces of the first and second elements. The alloy mass includes first, second, and third materials. A concentration of the first material varies concentration from a relatively higher amount at a location disposed toward the first element to a relatively lower amount toward the second element. A concentration of the second material varies in concentration from a relatively higher amount at a location disposed toward the second element to a relatively lower amount toward the first element. A melting point of the alloy mass is greater than a melting point of the first material in an unalloyed state and greater than a melting point of the second material in an unalloyed state.

In an example, the conductive alloy mass can surround an internal volume defined between confronting portions of the surfaces of the first and second elements. Further, the internal volume is hermetically sealed.

In another example, the first and second elements can respectively include first and second conductive elements that define portions of the surface of the first and second elements to which the conductive alloy masses are joined.

Another aspect of the present disclosure relates to a method for making a microelectronic assembly. The method includes aligning a first bond component with a second bond component such that the first and second bond components are in contact with each other. The first bond component is included in a first element having a substrate defining a surface and a first conductive element exposed at the surface. The first bond component includes a first material layer adjacent the first conductive element and a first protective layer overlying the first material layer. The second bond component is included in a second element including a substrate defining a surface and a second conductive element exposed at the surface. The second bond component includes a second material layer adjacent the second conductive element and a second protective layer overlying the first material layer. The method further includes heating the first and second bond components such that at least the first and second material layers diffuse together to form an alloy mass joining the first and second elements with one another.

The heating step can be carried out at a first temperature, and the alloy mass can have a melting point at a second temperature greater than the first temperature. The first and second protective layers can diffuse together and with the first and second material layers during the step of heating to further form the alloy mass. The step of heating can be carried out such that a temperature of the first and second bond components reaches between 30° C. and 200° C. After the step of heating, the electrically conductive alloy mass can have a melting point of between 200° C. and 800° C. In one example, the melting point of the alloy mass is greater than the melting points of either of the first or second material by at least 30 deg. C.

The first material layer can include at least one material component not present in the second material layer before the heating step. The first and second protective layers can be of a similar composition. The first material layer and the second material layer can be low melting point materials. In an example, the first and second low melting point materials can be different materials selected from tin, indium, gallium, and/or their respective alloys. The first protective layer can include copper, and the second protective layer can include at least one of copper, nickel, tungsten, cobalt, palladium, boron, gold, silver, and/or their respective alloys.

The first conductive element can include a bulk conductor layer and a seed layer that overlies the bulk conductor layer. The first bond component can be joined to the seed layer. The method can further include controlling a melting point of the first material layer and the first protective layer, to which the temperature thereof can be raised during the heating step, by the thickness of the seed layer. The seed layer can include copper. During the step of heating, the seed layer can also diffuse with the first and second material layers. In a further example, a portion of the first material layer can diffuse into the bulk conductor layer during heating. The first conductive element can include a barrier layer between the bulk conductor layer and the seed layer. In such an example, the barrier layer can prevent the first material from diffusing into the bulk conductor layer during the heating step. The barrier layer can include at least one of tantalum, tantalum nitride, molybdenum, chromium-molybdenum, nickel, phosphorous, tungsten, cobalt, palladium, titanium nitride, nickel phosphorus, cobalt phosphorus, titanium tungsten, nickel tungsten or combinations thereof.

The first substrate can be a first support material layer defining the surface of the first element, and the first conductive element can be a metalized via extending through a portion of the first support material layer. In such an example, the method can further include forming the first bond component over the metalized via by depositing the first material layer within an opening of a resist layer that overlies the surface of the first element, the opening being aligned with the metalized via. The step of forming the first bond component can further include depositing the first protective layer within the resist layer opening.

A seed layer can be positioned between the surface of the first element and the resist layer prior to depositing the first material layer within the opening and can further overlie the end surface of the metalized via. Further, the first material layer can be deposited over the seed layer within the opening, and the method can further include removing the resist layer and portions of the seed layer that are uncovered by the first material layer.

The first substrate can be a first support material layer defining the surface of the first element, and the first conductive element can be within an opening within the first support material layer. In such an example, an end surface of the first conductive element and the first bond component can be recessed within the opening, and the step of aligning the first bond component with the second bond component can include positioning the second bond component within the opening of the first support material layer. In a further example, the end surface of the first conductive element and the first bond component can be recessed within the hole such that an outer surface of the first protective layer is substantially co-planar with the surface of the first support material layer.

Another aspect of the present disclosure relates to a method for making a microelectronic assembly. The method includes aligning a first bond component exposed at a surface of a first element with a second bond component exposed at a surface of a second element such that the first and second bond components are in contact with each other. Each of the first and second elements includes a substrate, and the first bond component includes a first material layer and a first protective layer overlying the first material layer. The second bond component includes a second material layer and a second protective layer overlying the second material layer. The method further includes heating the first and second bond components such that at least the first and second material layers diffuse together to form an alloy mass joining the first and second elements with one another. The alloy mass has a melting point higher than melting points of the first and second material layers prior to heating. The first and second protective layers can diffuse together and with the first and second material layers during the step of heating to further form the alloy mass.

The first bond component can surround an area of the surface of the first element, and the second bond component can surround an area of the surface of the second element. In such an example, aligning the first bond component with the second bond component can define a volume within the first bond component, the second bond component, and the surrounded portions of the surfaces of the first and second elements. Further, the step of heating can causes the internal volume to become hermetically sealed by the conductive alloy mass.

The first and second elements can respectively include first and second conductive elements that define portions of the surface of the first and second elements to which the bond components are joined, and the step of heating can join the alloy mass between the first and second conductive elements.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIG. 4 shows exemplary concentration levels throughout the height of an alloy joining mass;

FIG. 5 shows an element including a plurality of conductive elements and related alloy masses according to another aspect of the present disclosure;

FIGS. 6 and 7 show bond components that can be used to form an alloy mass according to a method of the present disclosure;

FIGS. 8 and 9 show further steps in the alloy mass formation method;

DETAILED DESCRIPTION

Figure 2:
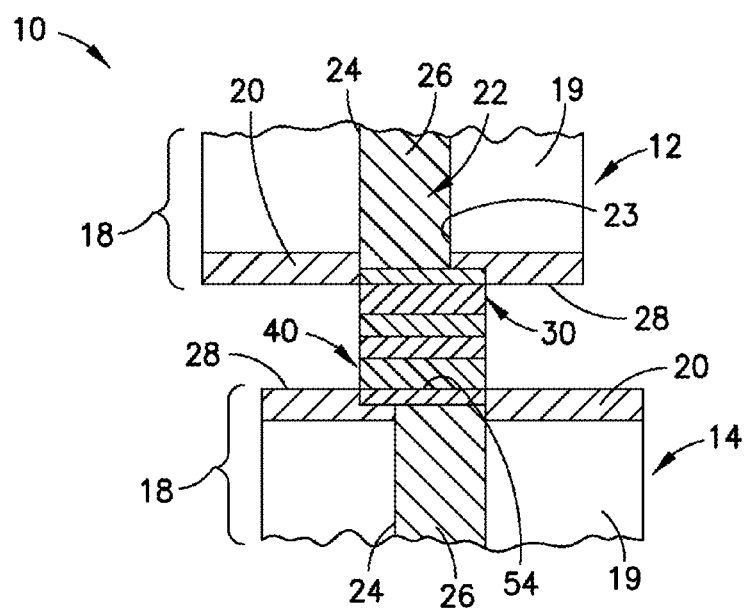
FIG. 2 shows elements including corresponding bond portions prior to joint formation in a method according to an aspect of the present disclosure.
Figure 3:
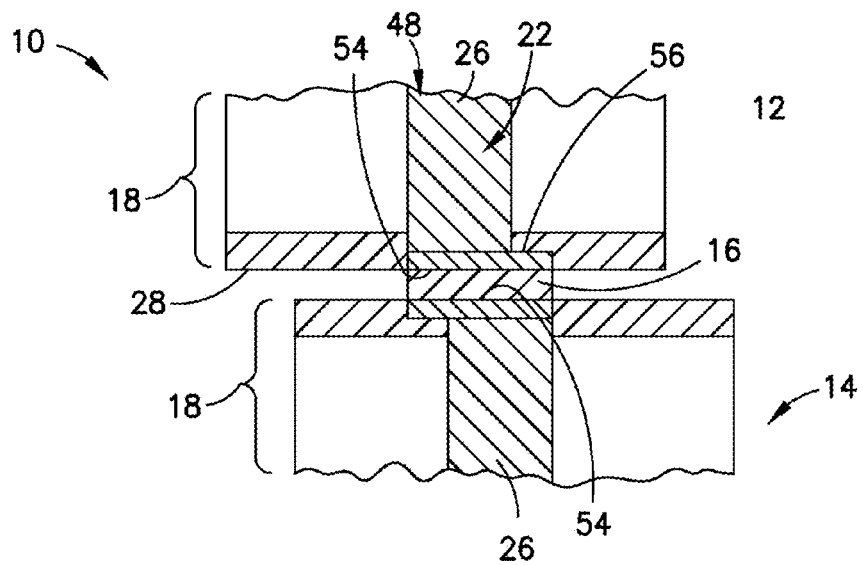
FIG. 3 shows an alloy mass joining the elements of FIG. 2 according to an aspect of the present disclosure.

Turning to the Figures, wherein similar numeric references are used in connection with similar features, FIG. 3 shows a microelectronic assembly 10 according to an aspect of the present disclosure. Assembly 10 includes first and second elements joined together by an alloy mass 16. In FIG. 3, which shows alloy mass 16 joining the elements of FIG. 2, the first and second elements are shown as portions of microelectronic devices, which can be in the form of packaged microelectronic elements, interposers, substrates, or the like. For example, first and second elements 12 and 14 are shown in FIGS. 2-3 as including a support material layer 18 that can, for example be of a semiconductor or a dielectric material layer such as found in an interposer structure, in a portion of a packaged microelectronic element, or in a portion of a semiconductor die. In an example, support material layer 18 can of one of a semiconductor material, or of a dielectric material, or of a combination of semiconductor and dielectric materials, such as in the example shown in FIGS. 2-3, wherein support material layer 18 includes a semiconductor layer 19 with a dielectric layer 20 overlying the semiconductor layer 19. In such an example, dielectric layer 20 can be used to insulate routing or other conductive features formed on the surface 28 of support material layer 18.

First and second elements 12, and 14 can include conductive elements, which can be traces, pads, posts, or the like. In the example shown in FIGS. 2-3, the conductive elements are metalized vias 22 that include a bulk conductive mass 26 within an opening 23 in support material layer 18 that is open to at least surface 28. In various examples, the opening 23 can be a blind opening that terminates within the support material layer 18. In other examples, the opening 23 can be a through opening that extends completely through support material layer 18. Further, in examples where support material layer 18 includes a semiconductor material, an insulating layer can be included within opening 23 between the bulk conductor layer 26 and the support material layer 18. The metalized vias 22 can be structured such that the end surfaces 54 of vias 22 are exposed at surface 28 of support material layer 18. As used in this disclosure with reference to a substrate, a statement that an electrically conductive element is "exposed at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

For example, end surface 54 can be flush with surface 28, or recessed below surface 28. In another example the end surface 54 of the metalized via 22 can be positioned outside of surface 28 such that the edge surface 56 is also exposed at surface 28 of support material layer.

As stated above, alloy mass 16 can be positioned between first element 12 and second element 14 to join elements 12 and 14 together. In the example shown in FIG. 3, alloy mass 16 is joined between confronting end surfaces 54 of metalized vias 22. In such an example, alloy mass 16 can be conductive such that the vias 22 are both mechanically and electrically joined together such that an electronic signal or the like can be transmitted from the first element 12 to the second element 14. This type of joining using alloy mass 16 can be used to connect a first element 12 in the form of, for example, a packaged microelectronic element to a second element 14 in the form of an interposer or the like that can further be electrically connected to a printed circuit board ("PCB") or the like for use in an electronic device or as part of an electronic system. In various examples, alloy mass 16 can have a height H of between about 1000 Angstroms to about 2000 Angstroms, although greater or lesser heights are also possible, depending on the configuration.

Alloy mass 16 can include at least three materials that vary in their respective concentrations throughout the structure of an individual alloy mass 16. As shown in FIG. 4, in an example, alloy mass 16 can include gallium (Ga), copper (Cu), and indium (In), and the concentrations of these materials within the alloy material as a whole, can vary throughout the structure of alloy mass 16 at least in a direction between first element 12 and second element 14. As depicted in the chart of FIG. 4, gallium can be present in an amount that varies with the distance from first element 12 with a peak concentration level 70 disposed toward element 12. In the particular example shown in the chart of FIG. 4, the peak concentration level 70 of gallium within alloy mass 16 can be located at the point of attachment between alloy mass 16 and via 22 of first element 12.

The concentration levels of all materials shown in FIG. 4 are exemplary and can be influenced, for example, by the structure of the elements 12 and 14 to which alloy mass 16 is connected. By way of illustration, the example assembly 10 shown in FIG. 4 includes vias 22 that both include barrier layers 32 between the bulk conductor layer 26 and alloy mass 16. The presence of barrier layers 32 can prevent any of the materials present in alloy mass 16 from diffusing into or otherwise becoming present within the bulk conductor layers 26. Accordingly, structures having no barrier layer may have different concentration levels at various locations throughout alloy mass 16, including around the bonding interface between bulk conductor layer 26 and alloy mass 16. Even in such an example, however, the peak concentration level of gallium may be located within or at the bonding interface between the alloy mass 16 and the bulk conductor layer 26.

Similarly, the concentration of indium within alloy mass 16 can be at a peak level 74 at a location generally disposed toward second element 14. Further, as discussed with respect to the concentration of gallium, above, the concentration profile of indium can deviate from that depicted in FIG. 4. For example, the concentration of Indium in the alloy may peak at a point closer to the first element 12. The profile may depend on various factors, including processing temperatures, processing time, initial concentration profile, other processing conditions or depending on various structural factors of the assembly 10, such as the presence or absence of a barrier layer, as discussed above. Further, the materials included in alloy mass 16 can vary. For example, alloy mass 16 can include a first material, that can be a low melting-point ("LMP") material such as gallium, as discussed above. In general, such a LMP material has a melting point lower than about 250° C. and can include gallium, tin, indium, or the like. In some examples, such as that of FIG. 4, where the alloy mass 16 is joined between conductive vias, it may be preferable for the first material to be a conductive material.

Alloy mass 16 includes a second material that is also a LMP material, which may also be a conductive material, and can be selected from any of the above-listed LMP materials. In some examples, it may be preferable for the first and second materials to be different LMP materials, such as discussed above, where the first material is gallium, and the second material is indium. As discussed above, alloy mass 16 can include a third material, such as copper in the example of FIG. 4. The third material can be a non-LMP material, such as one with a melting point of greater than about 160° C. In some examples, the third material can have a melting point of greater than 300° C. As with the first and second materials, the third material can be a conductive material, especially when used to join other conductive features together.

When the three materials are diffused together, such as in a manner similar to that illustrated in FIG. 4, the alloy mass 16 may have a melting point that is greater than either of the two LMP materials found therein. Further, the melting point of the alloy mass 16 can be less than 300° C. along at least a portion thereof such that the joint formed between the first and second elements 12 and 14 by alloy mass 16 can be at least partially "reworkable". In an example, in a reworkable joint, alloy mass 16 can be at least partially reflowed by heating to a temperature of less than 300° C. such that at least a portion of alloy mass 16 melts, allowing the position of elements 12 and 14 relative to each other to be at least partially adjusted or further allowing elements 12 and 14 to be detached from each other.

As shown in the chart of FIG. 4, depending on the nature of a specific LMP material layer used, the LMP material may migrate away from a surface, such as end surface 54 of via 22, during the formation of the alloy mass 16. Accordingly, the peak concentration level of indium 74 is shown as being spaced away from the corresponding surface 54 of element 14 with an increased level of copper therebelow. It is noted that in some examples, the peak concentration of indium may tend to invert with the peak concentration of gallium. An increased thickness of the protective layer 48 associated therewith can reduce the migration of indium or similar materials and can prevent such inversion.

When the positions of the concentration peaks for the first and second materials are described as being "disposed"

toward either one of the first or second elements 12 or 14, such a peak can be closer to the element 12 or 14 to which it is described as being disposed toward. For example, wherein the concentration peak 70 of gallium in FIG. 4 is described as being disposed toward the first element 12, it can mean that the peak 70 is closer to the first element 12 than the second element 14. Further, in such a convention, where the peak concentration 74 of the second material, for example indium as illustrated in FIG. 4, is described as being disposed toward second element 14, it can mean that such a peak 74 is closer to second element 14 than it is to first element 14. Alternatively, being disposed toward one or the other of the elements 12 or 14 can mean that such a peak is closer to such an element 12 or 14 compared to the peak concentration of the other materials. For example, the peak concentration 70 of gallium can be considered as disposed toward first element 12 in the example of FIG. 4, because it is closer to first element than the peak concentration 74 of indium, and vice-versa.

Alternatively, whether a peak concentration of a material is disposed toward an element 12 or 14 can be determined by whether such a peak concentration is within a certain distance from the element, such as a percentage distance of the entire height of alloy mass 16. For example, the peak concentration 70 of gallium can be considered as disposed toward first element 12 because it is within a distance of first element 12 that is less than 50% of the distance between first element 12 and second element 14 (or the distance between the end surfaces 54 of the vias 22 of first element 12 and second element 14, respectively). In further examples, such a percentage distance can be less than 25%, or less than 10% of the total distance between elements 12 and 14.

As further shown in FIG. 4, the third, or non-LMP material can also have a peak concentration, such as the peak concentration 72 of copper shown along line 76 in the graph of FIG. 4. As illustrated, the peak concentration 72 of the non-LMP material can be positioned between the peak concentrations 70 and 74 of the first and second LMP materials (gallium and indium, respectively in the example of FIG. 4). Accordingly, when determining which element 12 or 14 a peak concentration 70 or 74 of a LMP material is disposed toward in relative terms, such a peak concentration 70 or 74 can be closer to such an element 12 or 14 than both the peak concentration 74 or 70 of the other LMP material and the peak concentration 72 of the non-LMP material.

The distribution and relative concentrations of materials within the alloy mass 16 can be influenced by the method by which alloy mass 16 is formed between elements 12 and 14. A method for making an alloy mass 16 joined between and electrically connecting confronting end surface 54 of metalized vias 22 in a first element 12 and a second element 14 is shown in FIGS. 6-9, in accordance with an aspect of the present disclosure. In FIG. 6, a portion of a first element 12 is shown having a metalized via 22 at least partially through a support material layer 18 and exposed at a surface 28 thereof. A barrier layer 32 overlies a bulk conductor 26 within via and, in this example, defines the end surface 54 of the metalized via 22. As discussed above, the metalized via 22 can be without a barrier layer such that the end surface 54 is defined by the bulk conductor 26. The bulk conductor can be of a conductive metal such as copper, nickel, tungsten, or various alloys including these or other suitable materials. The barrier layer 32, if present, can be of a material such as tantalum nitride (TaN), molybdenum, molybdenum-chromium, or the like. A seed layer 34 can optionally be formed over barrier layer and/or the bulk conductor 26. The seed layer can be used to facilitate formation of additional layers over a barrier layer 32, for example, or over bulk conductors 26 of certain materials. The seed layer can also be used in contributing to various characteristics of the alloy mass 16 formed in this or a similar method, as discussed below. In other instances, such as when bulk conductor 26 is of copper and no barrier layer is present, a seed layer 34 may not be needed. Seed layer 34, if present, can be of copper or a similar conductive metal, and can be selected according to criteria discussed below.

A first LMP material layer 36 overlies at least the bulk conductor 26 with barrier layer 32 and/or seed layer 34, as discussed above, optionally positioned between bulk conductor 26 and the first LMP material layer 36. The LMP material layer 36 can include any of the LMP materials listed above. LMP layer 36 can include a single LMP material, such as gallium, as in the example described above with respect to FIG. 4, or in combination with another metal such as copper or the like. For example, LMP layer can be a single layer of gallium, a single layer of a gallium-copper alloy, a single layer of a indium-gallium-copper alloy, or a structure having multiple sublayers of gallium and copper, or one or more sublayers of gallium, copper, and indium or the like in a predetermined configuration to give LMP material layer 36 a desired overall percentage of the LMP material 36 that can also create a graded concentration level of the LMP material throughout the height of the layer 36. As such LMP material layer may not itself have a "low" melting point, as defined elsewhere herein, but can contain a desired amount of one of the LMP materials discussed herein.

A first protective layer 38 can overlie the first LMP material layer 36 and can include a similar material to that of bulk conductor 26, seed layer 34, or any non LMP material included in LMP material layer 36. In other examples, a selenium flash layer can be used for protective layer 38. The protective layer 38 can provide protection for the LMP material layer 34 against oxidation or the like or against damage during handling of element 12, for example. Protective layer can also provide at least a portion of a source of the non-LMP material within the finished alloy mass 16, as discussed above with respect to FIG. 4. The thickness of protective layer 38, in particular the relative thickness with respect to LMP material layer and/or seed layer 34 can influence behavior of the bond portion 30 during subsequent steps of the alloy mass 16 formation, as discussed below. In an example, protective layer 38 can have a thickness of about 200 Angstroms, although thicker or thinner protective layers 38 can be used, depending on, for example, the criteria discussed above. The various layers of first bond portion 30 or any other similar bond portions can be formed using electroplating, electroless plating, evaporation, chemical vapor deposition ("CVD") or the like.

As with first bond portion 30, a second bond portion 40 can be joined to or otherwise connected with second element 14. In the example shown in FIG. 7, second bond portion 40 overlies an end surface 54 of a metalized via 22 through at least a portion of support material layer 18 of second element 14. Similar to first bond portion 30, second bond portion 40 can optionally include a seed layer 44 that can overlie the bulk conductor 25 of via 22, and via 22 can optionally include a barrier layer 42 between seed layer 44 and bulk conductor 26. The barrier layer 42 and seed layer 44 can be of a similar construction and of similar compositions to those discussed above with the barrier layer 32 and seed layer 34 discussed above with respect to FIG. 6.

Second bond portion 40 further includes a LMP material layer 46 overlying via 22 of second element 14 and further overlying barrier layer 42 and seed layer 44, when present in the structure. LMP material layer 46 can include one of the LMP materials discussed above with respect to FIG. 4 and can further include a different LMP material than LMP material layer 36. For example, as illustrated in FIG. 4, LMP material layer 46 can include indium. Further, LMP material layer 46 can include additional materials, such as a conductive metal such as copper or the like. Any additional non-LMP material within LMP material layer 46 can be mixed with the LMP material in the form of an alloy or can be included in a number of sublayers to LMP material layer 46 that can be configured to provide a desired concentration of materials within layer 46 and/or to provide a desired gradation of materials through a thickness of layer 46, as discussed above.

As shown in FIG. 8, first element 12 and second element 14 can be positioned such that the respective surfaces 28 confront each other and such that first bond portion 30 is aligned with second bond portion 40 and are in contact with each other along the protective layers 38 and 48 thereof. At least bond portions 30 and 40 can then be heated to a predetermined temperature to cause the LMP materials within the respective LMP material layers 36 and 46 to melt and to consume the non-LMP materials found in any one of the protective layers 38 and 48, the seed layers 34 and 44, or within the LMP material layers 36 and 46 themselves. During such heating, the alloy mass 16 can form as the consumed non-LMP materials become solid particles suspended in a liquid phase of the LMP materials and as the liquid LMP materials mix together. Such a mixture will have a corresponding melting point for the mixture as a whole that will vary according to the percentages (by weight or by atomic mass) of the components thereof, at which point the non-LMP material will also melt into the mixture and the entire system will be in the liquid phase. Similarly, a LMP material, such as gallium, with a lower melting point that another LMP material, such as indium, can consume the other LMP material at a temperature above its melting point (30° C. in the example of gallium) but below the other LMP material's melting point (about 156° C. for indium).

In some variations of bond portions 30 and 40 a protective layer 38 or 48 may not be needed. For example, in variations of bond portions 30 and 40 wherein the LMP material layer 36 includes a plurality of plated layers in a pattern of LMP materials and non-LMP materials, the uppermost of such layers can be of a protective, non-LMP material, such as copper. In other variations, the composition of the LMP material layers 35 or 46 can be graded alloy structures with at least enough of a protective material near an upper portion thereof to negate the need for a separate protective layer 38 or 48. In this and possibly in other variations (such as those wherein the protective layer is a volatile material that evaporates during heating), the materials of LMP material layer would not diffuse with any protective layer materials. In other instance, a protective layer may not be necessary, such as when the first and second elements 12 and 14 are formed and assembled in an environment with a low level of oxygen or are formed and assembled together before oxidization can take place.

Further, the amount of non-LMP material that can be consumed by the liquid LMP material varies with the temperature of the system. That is, the temperature required for consumption of the non-LMP material within such a system increases as the amount of non-LMP material increases. Accordingly, the ratio of LMP material to non-LMP material within the bond portions 30 and 40 increases, the temperature required for consumption of the protective layers 38 and 48 increases, which accordingly increases the temperature required for the separate materials and components of the bond portions 30 and 40 to become adequately mixed to form alloy mass 16 that is joined to both first element 12 and second element 14. As shown in the exemplary diagram of FIG. 4, the mixture does not need to be homogeneous to achieve alloy mass 16 formation, but at least all of the protective layers 38 and 48 should be consumed. In some examples the alloy mass 16 can be adequately formed after between 10 and 30 minutes of exposure to the proscribed temperature. This can allow the materials within the alloy mass 16 to be mixed enough so that when cooled, the first and second elements will be joined together and, in the case of the assembly 10 of FIG. 9, the vias 22 of the respective elements 12 and 14 are electrically connected together.

Because the temperature needed for alloy mass 16 formation increases with the amount of non-LMP material included within the bond portions 30 and 40, this temperature, which can be referred to as the "bonding temperature" can be controlled by the thicknesses of the protective layers 38 and 48 and any seed layers, such as seed layers 34 and 44, present in the bond portions 30 and 40. By selecting various materials from those listed above and by adjusting the relative quantities of the various LMP materials and the non-LMP materials within the bond portions 30 and 40, welding temperatures can be achieved within the range of 30° C. to 150° C. In the example discussed with respect to FIGS. 6-9, wherein the first LMP material layer 36 includes indium, the second LMP material layer includes gallium, and the seed layers 34 and 44 as well as the protective layers 38 and 48 are copper, the starting thickness of the seed layer may be 30-600 nm, the starting thickness of first material layer of gallium may be 100-500 nm, and the starting thickness of the protective layer may be 10-100 nm. Similar thicknesses could be used for the second bond portion 40. In variations of the bond portions 30 and 40 that include a non-LMP material within LMP material layer 36 or 46, the proportion of such a non-LMP material to the LMP material can also influence the bonding temperature of the bond portions 30 and 40.

The diffusion of the materials from the various layers of the bond portions 30 and 40 together into alloy mass 16 results in a structure with a higher melting point than that of the LMP materials included therein, such as gallium and indium, as used in the example above. Further, once alloy mass 16 cools and solidifies, the subsequent melting point thereof can be higher than the welding temperature that was used in formation thereof. Various combinations of the materials listed above for the layers within the bond portions 30 and 40 can result in bond portions 30 and 40 with welding temperatures in the ranges given above that can form alloy masses 16 with melting temperatures also in the ranges given above. The particular welding temperatures of the bond portions and melting temperatures of the resulting alloy masses 16 can be controlled or influenced by adjusting the relative proportions of the components of the bond portions 30 and 40 as discussed above. In other words, the non-LMP material can be selected to increase the melting point of an alloy including the non-LMP material and at least one other LMP material.

The selective composition of bond portions 30 and 40 can be designed to control the approximate welding temperatures thereof and the melting temperature of the resulting alloy mass 16 according to various criteria. For example, it may be desired to form alloy masses 16 that are reworkable at temperatures that can be reached without causing damage to other portions of the associated elements (such as elements 12 or 14) or even without causing other bonds within the same package 10 or the like to themselves become reworkable. Such criteria can be achieved with a relatively higher LMP material to non-LMP material composition. Similarly, it may be desired for some bond portions that are used to form alloy masses to have a low welding temperature so that they can be melted and joined together without causing already-formed joints or bonds to reflow or become damaged. On the other hand, it may be desired for some alloy masses 16 that are used to join elements together to have a relatively higher melting temperature so that they are more resistant to higher temperature applications or will not themselves reflow during the creation of subsequent alloy masses 16 or other joints in an assembly. Bond portions 30 and 40 can be made according to the above criteria to achieve these characteristics and to achieve such characteristics in alloy masses 16 that they are used to form.

As discussed above, such alloy masses 16 can be used to join elements having a number of different microelectronic applications at various features thereof. In the example discussed above, alloy mass 16 is used to electrically and mechanically join conductive vias 22 in an element that can be an interposer, a microelectronic die, a packaged microelectronic element, or the like. While only a single alloy mass 16 is shown connected to corresponding metalized via 22 in each of the first element 12 and the second element 14, such an assembly 10 can include a plurality of metalized vias 22 in each of the first element and the second element with corresponding alloy masses 16 attached between respective ones of the plurality of vias 22. Such vias can be arranged in any number of configurations used in microelectronic assemblies or packaged microelectronic devices, such as in an array of rows and columns of vias 22 spaced apart in, for example a minimum pitch or the like. Other features in similar arrays can be joined using alloy masses of the type discussed herein, such as contact pads connected with one or more other electrically conductive features such as traces or the like or conductive pins or posts that can overlie and electrically connect with contact pads or the like.

Figure 1A:
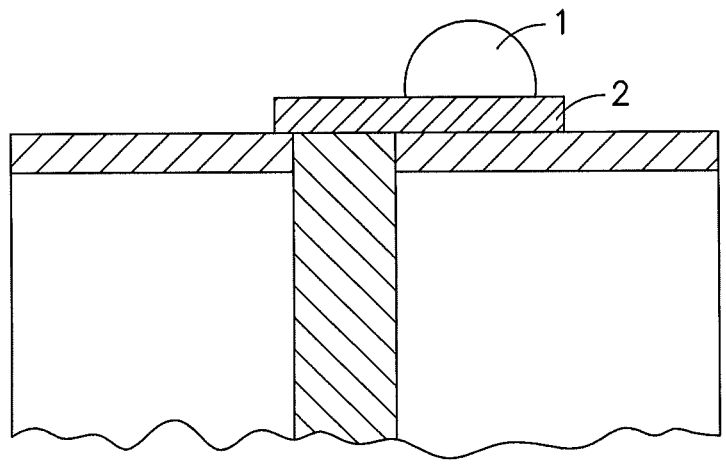
FIGS. 1A-1C show various structures in art related to the present disclosure.
Figure 1B:
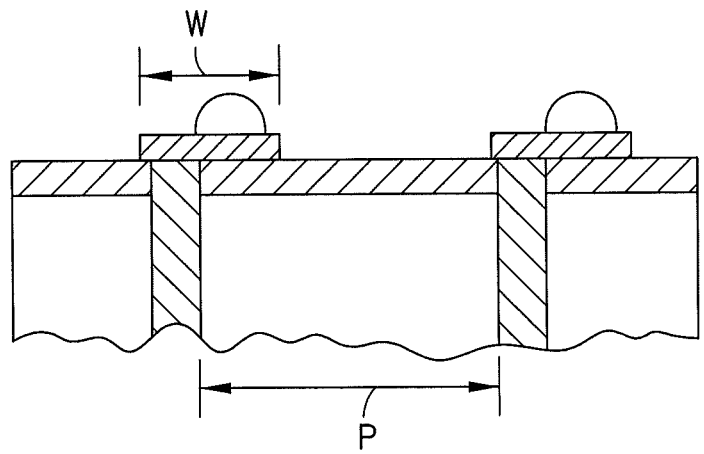
Figure 1C:
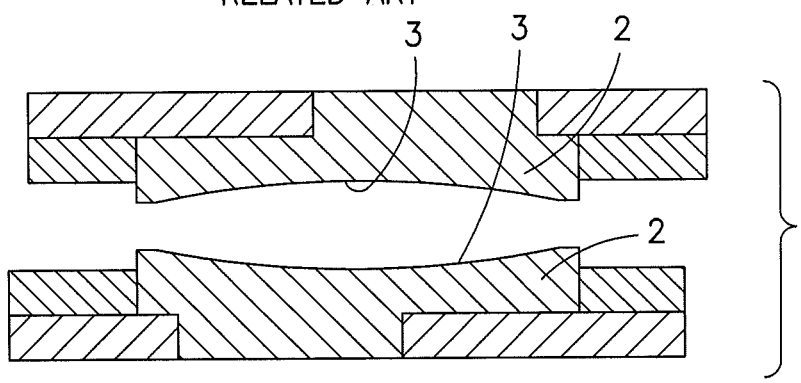

In other applications, such features can be joined with masses of solder or other joining metals, which require a minimum pitch among the joined features of at least 1.5 times the width of that feature, as depicted in FIG. 1C. As illustrated in FIG. 5, bond portions 30 and 40 of the above description can be used to join conductive features by formation of an alloy mass 16 in applications where the conductive features are in an array with a minimum pitch P that is less than the width of the conductive features themselves. Further, in assemblies with joints between conductive features formed with masses of conductive joining material, such a solder, the bond height or spacing between elements can be directly related to the width needed for such conductive features. That is, greater widths of the conductive features are necessitated by greater bond height. In structures using the presently-described alloy masses 16 for joining of conductive features, such features can have widths W of less than 6 μm, and in some cases, less than 3 μm, at bond heights greater than, for example 6 μm, although greater widths are possible. The use of conductive features with decreased widths at their respective bonding interfaces can also result in structures that can be more reliably made with less dishing at the interface surfaces of the conductive features. As shown in FIG. 1B, large contact pads 2 used in connection with other joining structures can exhibit dishing (or the formation of a convexity) along surface 3 due to polishing or other steps in the formation of such elements. This can result in decreased joint reliability, either during manufacture or use of such elements.

Figure 10:
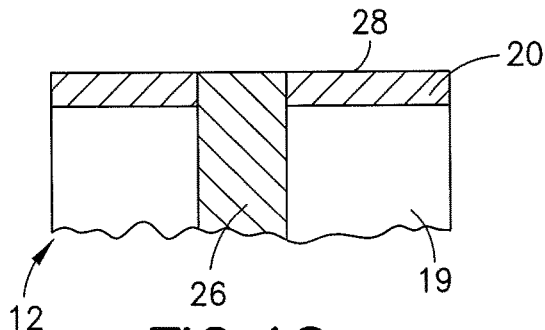
FIGS. 10-15 show an element during various stages of a method for making bond components according to an aspect of the disclosure.

Bond portions 30 and 40 of the type discussed above in previous examples can be formed on conductive features by a method illustrated in FIGS. 10-15. In this specific example, bond portions 30 and 40 are shown as being formed over end surfaces 54 of conductive vias 22 at least partially through a support structure 18. Such elements can be made by forming holes in a semiconductor or dielectric layer, coating such holes, if necessary, and by depositing a conductive metal therein. Such holes can be blind and can originate through a surface opposite surface 28. In such a method, the semiconductor layer 19 can be back ground and etched to expose the ends of the vias before depositing a dielectric layer 20 over a semiconductor layer 19, which can be polished to expose the end surfaces 54 of the metalized vias 22 to achieve the structure shown FIG. 10. Although only a single via 22 is shown in the package of FIG. 10, multiple vias can be simultaneously formed in a package using a similar method. Other methods of via formation can also be used.

Figure 11:
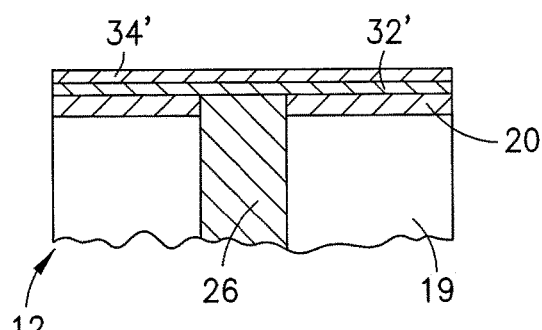
Figure 12:
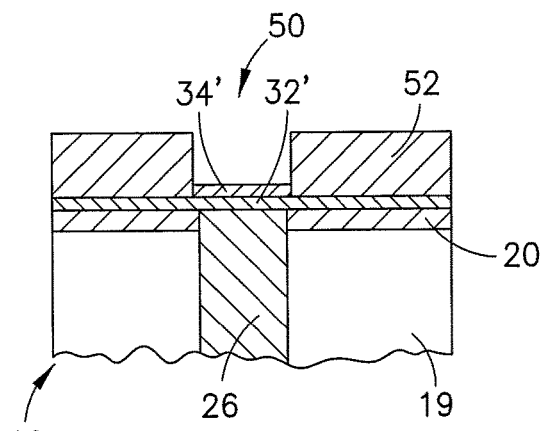
Figure 13:
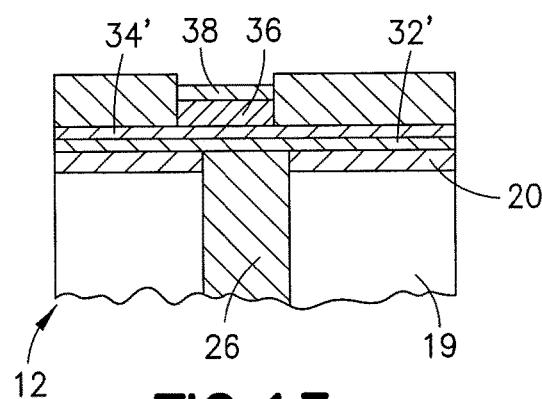
Figure 14:
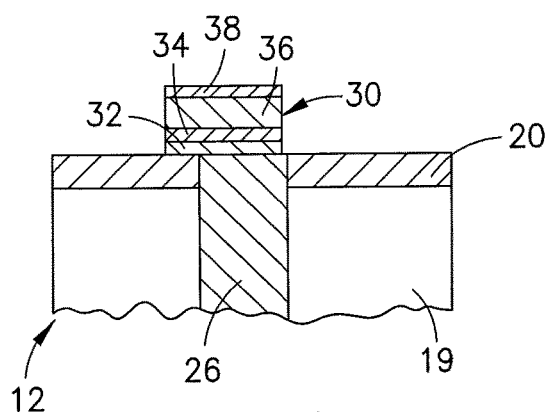
Figure 15:
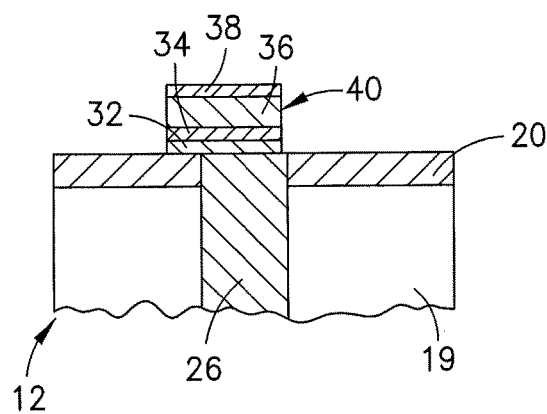

As shown in FIG. 11, if a barrier layer 32,42 and/or seed layer 34,44 are desired, layers 32' and 34' of the material desired for such layers can be deposited over surface 28 of element 12. A resist layer 52 can be positioned over surface 28 and over any bond material layer 32' or seed material layer 34' present on element 12 and openings 50 can be formed or otherwise present in the resist layer 52 that overlie the vias 22 or any other locations where bond portions 30 are desired. The LMP material layer 36, according to any of the compositions discussed above, can be deposited within opening 50, and then the protective layer 38 can be deposited over LMP material layer 36. The resist layer 52 can then be removed leaving the desired number of bond portions 30 on element 12 in the desired locations. Subsequently, the portions of the bond material layer 32' and seed material layer 34' outside of the LMP material layer 36 can be stripped away. A similar method can be used to make a bond portion 40 on element 14, as shown in FIG. 15. The elements 12 and 14 can then be aligned and heated to make alloy masses 16, as described above. Similar methods can be used to make similar bond portions on other conductive features, such as pads, posts, or the like.

Figure 16:
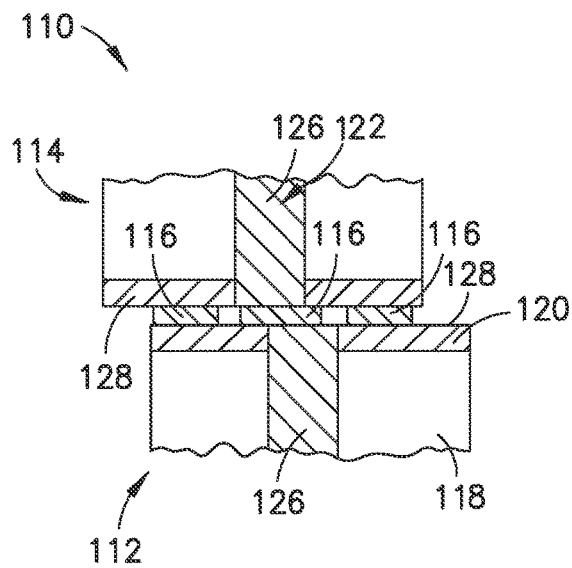
FIG. 16 shows an assembly according to another aspect of the disclosure having alloy masses joining surfaces of adjacent substrates and conductive elements within each of the substrates.

Bond portions of the type discussed above to create alloy masses for bonding elements together can be used in variations of the elements discussed above, such as that shown in FIG. 16, wherein additional alloy masses 116 are used to join support material layers 118 of packages 112 and 114 together at portions of surface 128 that do not include conductive features. As shown, some alloy masses 116 can be used in the same package to join conductive elements, such as metalized vias 122, although in some applications, alloy masses 116 can be used to join elements 112 and 114 along surface 128 only. The alloy masses 116 joined to surface 128 can be made by the same method described above by including openings 50 within the resist layer 52 that do not overlie any conductive features. In a further variation of that shown in FIG. 16, the alloy masses 116 can extend in one or more lateral directions along surfaces 128 such that the alloy masses 116 can define, along with confronting portions of surfaces 128, an internal volume. In some applications, a single, continuous alloy mass 116 of this type can completely enclose such an internal volume and, in a further example, hermetically seal such a volume.

Figure 17:
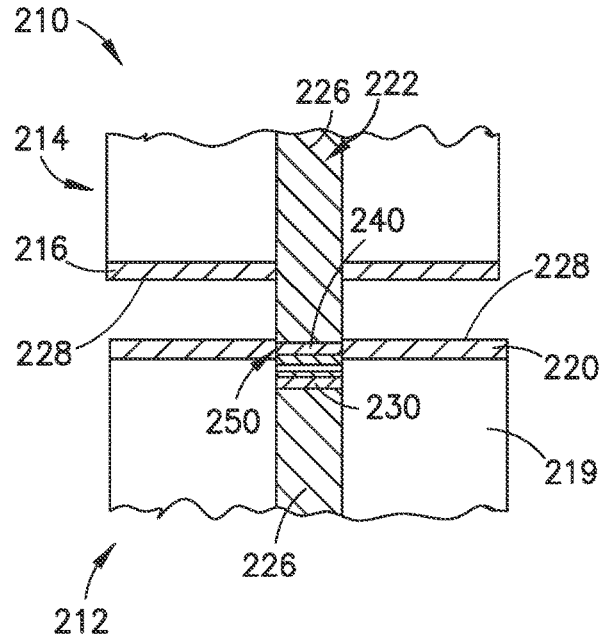
FIG. 17 shows an assembly according to another aspect of the disclosure wherein bond portions can be used to form an alloy mass joining a recessed conductive element with a projecting conductive element.
Figure 18:
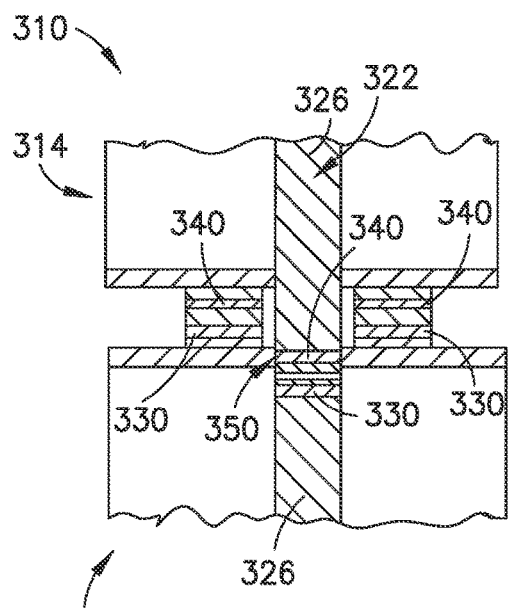
FIGS. 18 and 19 show assemblies according to further aspects of the disclosure that include combinations of the features of FIGS. 16 and 17.
Figure 19:
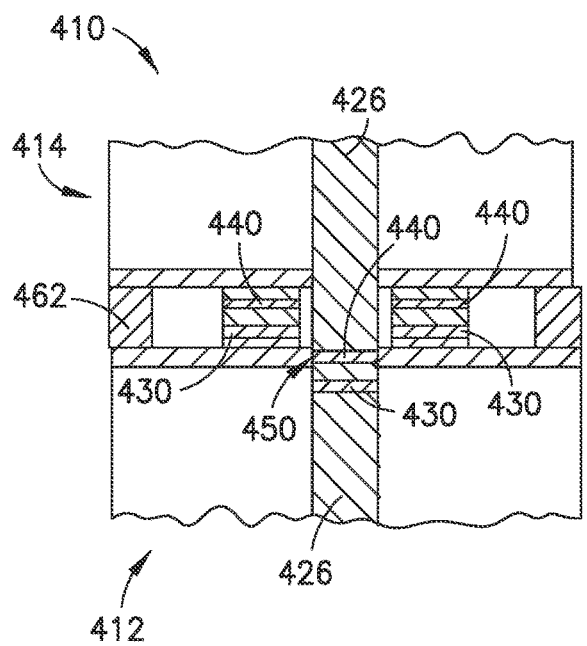

As shown in FIG. 17, bond portions 230 and 240 similar to those described elsewhere above can overlie conductive vias 222 or other features that are recessed in one element 212 and project above surface 228 in the other element 214. In a variation, via 222 of element 212 can be flush with surface 228 and only bond portion 230 can project above surface 228, depending on the depth with which bond portion 240 is recessed within the opening associated with via 222. In either form, such an arrangement can result in bond portions 230 and 240 that are self-aligning during assembly. Once the bond portions 230 and 240 are aligned, they can be fused, as discussed above to make alloy mass or alloy masses that joint the elements 212 and 214 together. Further variations of such an assembly are shown in FIGS. 18 and 19, in which the assembly 310 of FIG. 18 includes projecting and recessed vias 322, as in the example of FIG. 17 along with the surface bonded bond portions 330 and 340 described with respect to FIG. 16. As shown in FIG. 19, such bond portions 430 and 440 can further be used in an assembly 410 joining elements 412 and 414 together, including an edge chip structure 462.

Figure 20:
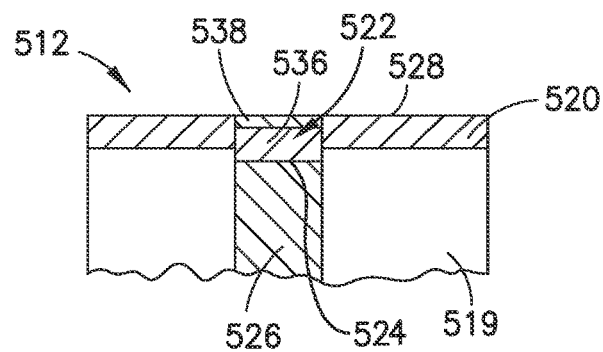
FIGS. 20-24 show structures that can use bond components such as those discussed above with varying relationships between surfaces, conductive elements, and the bond components.
Figure 21:
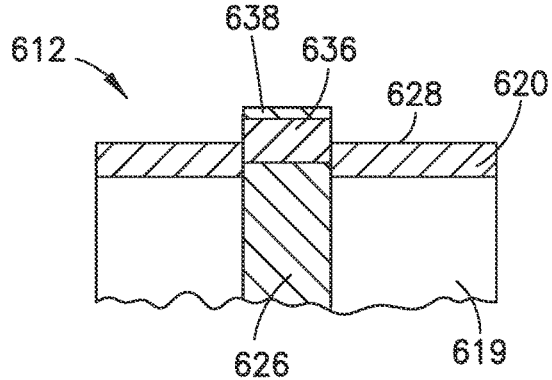
Figure 22:
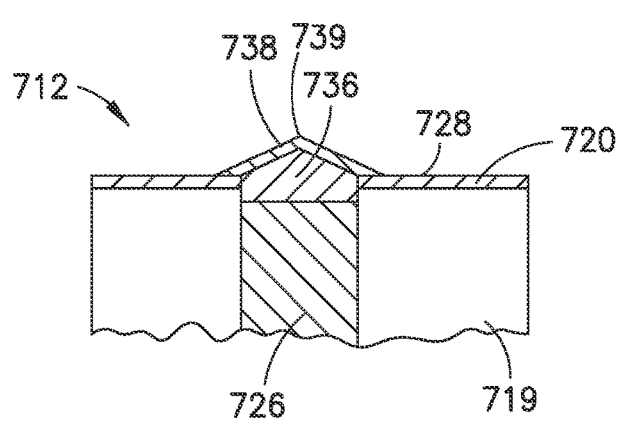
Figure 23:
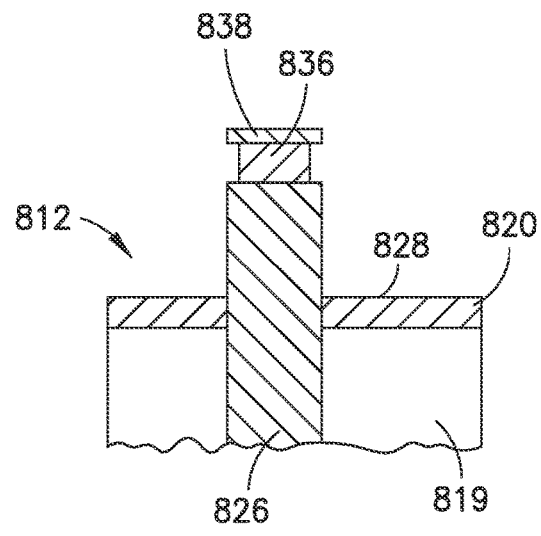
Figure 24:
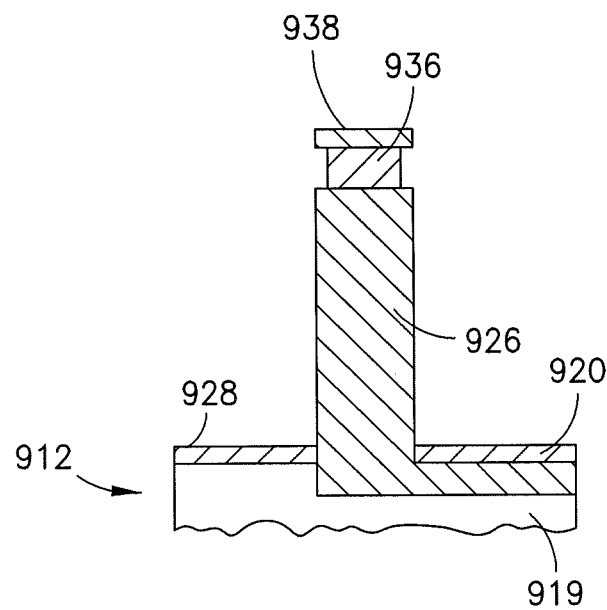

Additionally, as shown in FIGS. 20-23, various different configurations for conductive features and related bond portions are possible within the framework discussed above, examples of which are shown in FIGS. 20-24. As shown in FIG. 20, the end surface 524 of via 522 can be recessed below surface 528 such that the LMP material layer 536 or 546 can also be positioned below surface 528 with protective layer 538 or 548 being aligned with or flush with surface 528. In the example, of FIG. 21, only a portion of LMP material layer 636 or 646 of the element 612 can be positioned beneath surface 628, with the remainder projecting thereabove such that protective layer 638 or 648 is positioned above surface 628. FIG. 22 shows another element 712 with a variation of a bond portion 730 or 740 that can be tapered along a portion of LMP material layer 736 or 746 such that protective layer 738 or 748 includes an apex 739 along a portion thereof. FIG. 23 shows a variation of an element 812 wherein a portion of the bulk conductor 826 projects above surface 828 with bond portion 830 or 840 formed thereon and spaced above surface 828. Such a structure can be used to provide greater spacing between elements or to create self-aligning features, as discussed above with respect to FIG. 17. In a further alternative example, element 912 in FIG. 24 shows a bond portion 930 on a conductive post 962. Such a structure can be used to connect with another bond portion joined to a conductive pad, another post, or the like.

Figure 25:
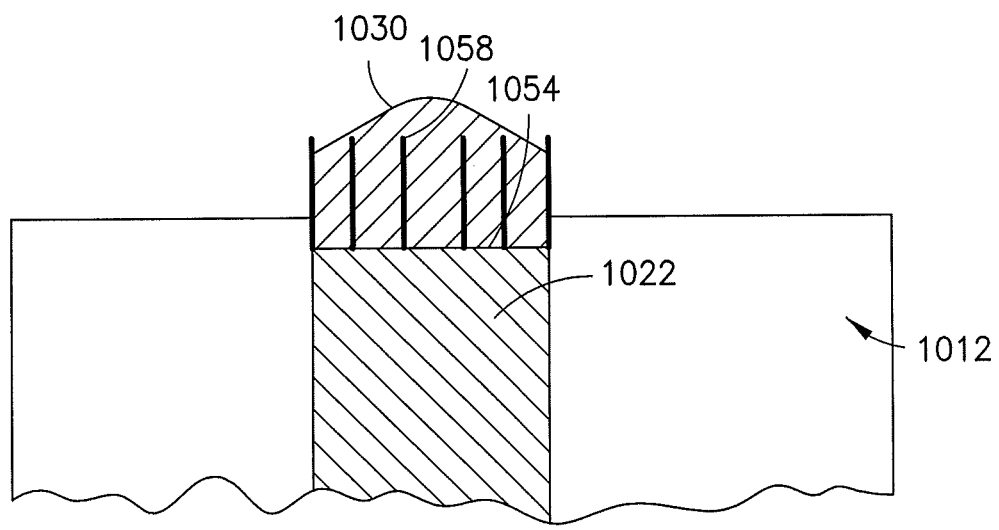
FIG. 25 shows a bond component over a conductive element with reinforcing structures therein.

As shown in FIG. 25, either or both bond portions of the type discussed herein can include a reinforcing structure within the element 1012 to help the bond portion retain its shape during welding or reflow, as discussed above. In example, a bond portion 1030 is shown on a bulk conductor of a conductive via 1022 in FIG. 25. A plurality of capillary structures 1058 project from the end surface 1054 of the bulk conductor layer 1026 of metalized via 1022. The capillary structures 1058 can be of a flexible material such as polyimide or the like and can be of a material that is heat resistant up to at least the intended welding temperature of the bond portion 1030. The capillary structures 1058 can be spaced apart on end surface 1054 such that the bond portion 1030 can make an adequate electrical connection with the metalized via 22. Further, the capillary structures 1058 can be of a sufficient size and density such that the surface tension of the bond portion 1030, when melted, maintains the general shaped desired for bond portion 1030 and a resulting alloy mass. Accordingly, bond portions 1030 can generally be formed that have higher bonding temperatures than those of bond portions of similar compositions without capillary elements. Any flexibility of capillary structures 1058 can make the capillary structures resistant to breaking or the like under pressure between elements during assembly thereof. The capillary structures 1058 can be formed by depositing a polyimide layer over a seed layer 1034 and then patterning the polyimide layer into the desired shape and density of the capillary structures 1058 and to expose the seed layer. Further, the presence of the seed layer 1034 can minimize the formation of intermetallic structures within the bulk conductor 1026.

Although the description herein has been made with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A microelectronic assembly, comprising:
   a first substrate having a first surface and first conductive elements;
   a second substrate having a second surface and second conductive elements; and
   first conductive masses disposed between the first substrate and the second substrate, each first conductive mass joined to a respective pair of the first and second conductive elements, and each first conductive mass comprising a first material, a second material, and a third material, wherein:
   the third material has a higher melting point than a melting point of the first material and a melting point of the second material;
   the concentration of the first material varies from a relatively high concentration at a location proximate to the respective first conductive element to a relatively low concentration at a location proximate to the respective second conductive element;
   the concentration of the second material changes from a relatively high concentration at a location adjacent to the respective second conductive element to a relatively low concentration at a location adjacent to the respective first conductive element;
   the location of the highest concentration of the third material in each first conductive mass is disposed between the respective locations of the highest concentrations of the first material and the second material; and
   a spacing between adjacent first conductive masses is less than the width of each first conductive mass.

2. The assembly of claim 1, wherein the width of each first conductive mass is less than twenty five microns at bonding interfaces with the respective first and second conductive elements.

3. The assembly of claim 1, wherein each first conductive mass is devoid of solder.

4. The assembly of claim 1, wherein:
   the first substrate comprises a first support material layer,
   the first support material layer defines the first surface and comprises at least one of a semiconductor material or a dielectric material, and
   at least one of the first conductive elements comprises a metalized via exposed at the first surface and extending through a portion of the first support material layer.

5. The assembly of claim 4, wherein a portion of the metalized via is positioned outside the first support material layer.

6. The assembly of claim 5, wherein:
each second conductive element comprises a second support material layer,
the second support material layer defines the second surface and comprises at least one of a semiconductor or dielectric material,
at least one of the second conductive elements comprises a metalized via extending through a portion of the second support material layer, and
at least a portion of each first conductive mass is disposed in the second support material layer.

7. The assembly of claim 6, further comprising:
a plurality of second conductive masses between the first surface and the second surface, each second conductive mass joined to nonconductive portions of the first and second surfaces.

8. The assembly of claim 7, wherein one or more of the plurality of second conductive masses form are disposed proximate edges of the first and second surfaces.

9. The assembly of claim 1, wherein the third material comprises at least one of copper, nickel, tungsten, cobalt, phosphorous, palladium, boron, gold, or silver.

10. The assembly of claim 1, wherein the first and second materials each comprise at least one of tin, indium, or gallium.

11. The assembly of claim 1, wherein:
each first conductive element comprises a bulk conductor mass, and
the bulk conductor mass comprises first material diffused from the first conductive mass.

12. The assembly of claim 11, wherein each first conductive element further comprises a barrier layer overlying the bulk conductor mass, and the first conductive mass is bonded to the barrier layer.

13. A microelectronic assembly comprising:
a first substrate having a first nonconductive surface and first conductive elements;
a second substrate having a second nonconductive surface and second conductive elements, the first nonconductive surface disposed opposite of and spaced apart from the second nonconductive surface to define a gap region therebetween; and
a plurality of first conductive masses disposed in the gap region, each first conductive mass electrically connecting a respective pair of the first and second conductive elements, wherein:
each first conductive mass comprises (i) a first material having a first melting point, (ii) a second material having a second melting point, and (iii) a third material having a third melting point greater than the first melting point and the second melting point;
the concentration of the first material changes from a relatively high concentration at a location adjacent to the respective first conductive element to a relatively low concentration at a location adjacent to the respective second conductive element;
the concentration of the second material changes from a relatively high concentration at a location adjacent to the respective second conductive element to a relatively low concentration at a location adjacent to the respective first conductive element;
the concentration of the third material is greater at a location between a first highest concentration of the first material and a second highest concentration of the second material than at locations adjacent to either the first or second conductive elements;
each first conductive mass has a width of less than five microns at bonding interfaces with the respective first and second conductive elements; and
a spacing between adjacent ones of the first conductive masses is less than the width of each first conductive mass at the bonding interfaces.

14. The assembly of claim 13, further comprising:
a plurality of second conductive masses disposed in the gap region between respective pairs of the first and second conductive elements, each second conductive mass joined to a respective portions of the first and second nonconductive surfaces.

15. The assembly of claim 14, wherein one or more of the plurality of second conductive masses are disposed proximate to edges of the first and second surfaces.

16. The assembly of claim 13, wherein:
the first nonconductive surface comprises a support material layer, and
at least one of the first conductive elements comprises a metalized via extending through the support material layer.

17. The assembly of claim 16, wherein a portion of the metalized via extends outside the support material layer.

18. The assembly of claim 13, wherein the third material comprises at least one of copper, nickel, tungsten, cobalt, phosphorous, palladium, boron, gold, and silver.

19. The assembly of claim 13, wherein:
each of the first and second materials comprise at least one of tin, indium, and gallium.

20. The assembly of claim 13, wherein each first conductive element comprises a bulk conductor mass and a barrier layer overlying the bulk conductor mass, and each first conductive is bonded to the barrier layer.

* * * * *